(12) United States Patent
Gianchandani et al.

(10) Patent No.: US 9,950,922 B2
(45) Date of Patent: Apr. 24, 2018

(54) PACKAGED MICROSYSTEMS

(71) Applicant: THE REGENTS OF THE UNIVERSITY OF MICHIGAN, Ann Arbor, MI (US)

(72) Inventors: Yogesh Gianchandani, Ann Arbor, MI (US); Tao Li, Ann Arbor, MI (US); Yushu Ma, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/127,237

(22) PCT Filed: Mar. 17, 2015

(86) PCT No.: PCT/US2015/021100
§ 371 (c)(1),
(2) Date: Sep. 19, 2016

(87) PCT Pub. No.: WO2015/142949
PCT Pub. Date: Sep. 24, 2015

(65) Prior Publication Data
US 2017/0174506 A1 Jun. 22, 2017

Related U.S. Application Data

(60) Provisional application No. 61/954,303, filed on Mar. 17, 2014.

(51) Int. Cl.
*B81B 7/00* (2006.01)
*B81B 7/02* (2006.01)
(Continued)

(52) U.S. Cl.
CPC ............. *B81B 7/0048* (2013.01); *B81B 7/02* (2013.01); *B81C 3/004* (2013.01); *H01L 23/043* (2013.01);
(Continued)

(58) Field of Classification Search
CPC .......... B81B 7/0048; B81B 7/02; B81C 3/004
See application file for complete search history.

(56) References Cited

U.S. PATENT DOCUMENTS 7,701,631 B2 4/2010 Floyd et al.
2013/0145853 A1 6/2013 Donzier et al.
(Continued)

FOREIGN PATENT DOCUMENTS

EP 1640775 A1 3/2006
RU 2410793 C2 1/2011
(Continued)

OTHER PUBLICATIONS

International Search Report for International application No. PCT/US2015/021100, dated Sep. 3, 2015, 3 pages.
(Continued)

*Primary Examiner* — Errol Fernandes
(74) *Attorney, Agent, or Firm* — Kelly Kordzik; Matheson Keys Daffer & Kordzik PLLC

(57) ABSTRACT

A sub-millimeter packaged microsystem includes a microsystem located in a sealed cavity defined between first and second portions of a micropackage. One or both micropackage portions can be fabricated from a metal suitable for use in a harsh environment, such as an oil well environment. The microsystem includes electronic components and can be configured to communicate with external components through a wall of the micropackage by wireless communication or by conductive feedthroughs. Pluralities of microsystems, first micropackage portions, and/or second micropackage portions are simultaneously placed during a batch assembly process. The assembly process may include micro-crimping the first and second micropackaging portions together without the need for bonding materials and related process steps.

33 Claims, 12 Drawing Sheets

(51) Int. Cl.
   *B81C 3/00* (2006.01)
   *H01L 23/043* (2006.01)
   *H01L 23/053* (2006.01)
(52) U.S. Cl.
   CPC .......... *H01L 23/053* (2013.01); *B81B 7/0032* (2013.01); *B81B 7/0045* (2013.01); *B81B 2201/0264* (2013.01); *B81C 3/00* (2013.01); *B81C 3/002* (2013.01)

(56) References Cited

U.S. PATENT DOCUMENTS

| | | |
|---|---|---|
| 2013/0285171 A1 | 10/2013 | Najafi et al. |
| 2015/0075279 A1 | 3/2015 | Donzier |
| 2016/0186533 A1 | 6/2016 | Donzier |

FOREIGN PATENT DOCUMENTS

| | | |
|---|---|---|
| RU | 2448896 C2 | 4/2012 |
| RU | 130445 U1 | 7/2013 |
| WO | WO2013083821 A1 | 6/2013 |
| WO | WO2013153224 A1 | 6/2013 |
| WO | WO2013190093 A2 | 10/2013 |

OTHER PUBLICATIONS

Written Opinion for International application No. PCT/US2015/021100, dated Sep. 3, 2015, 5 pages.

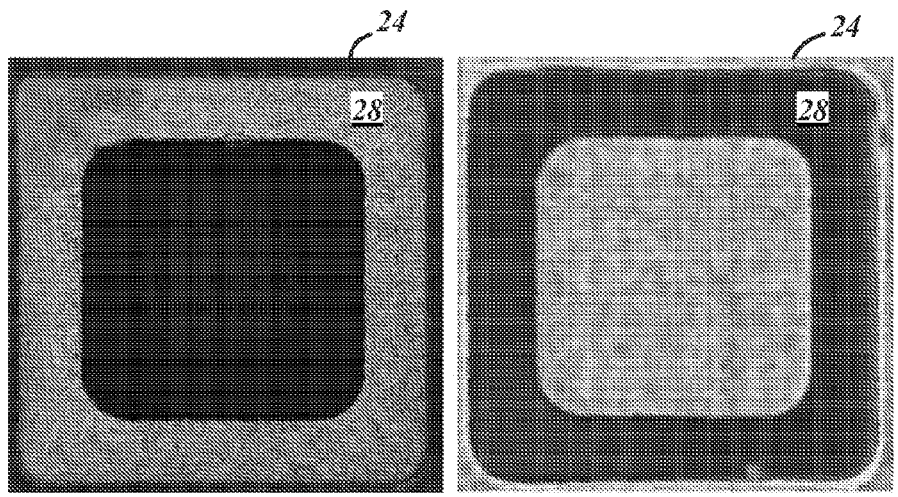
*FIG. 6A*  *FIG. 6B*
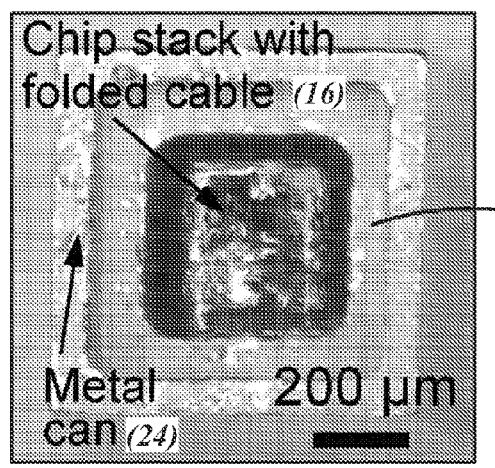
*FIG. 7*
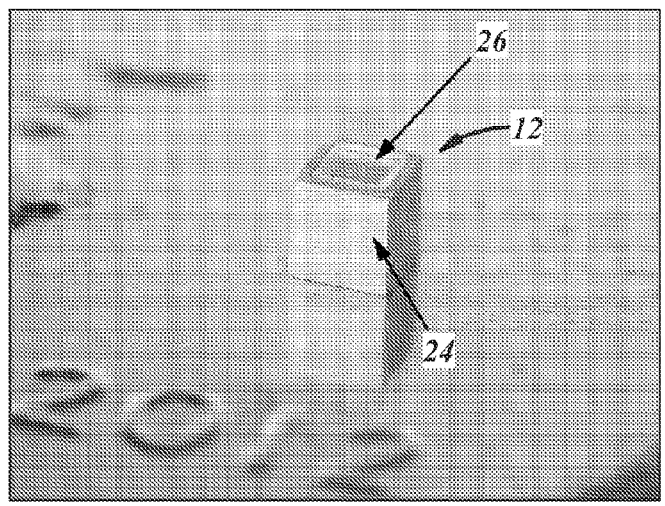
*FIG. 8*

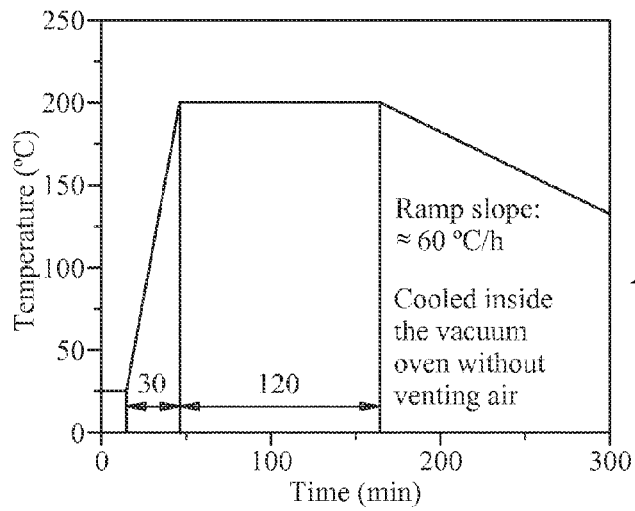
FIG. 9
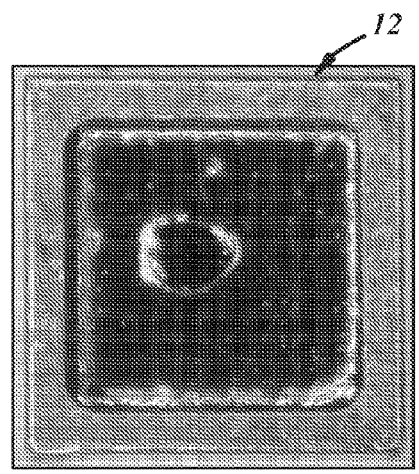
FIG. 10
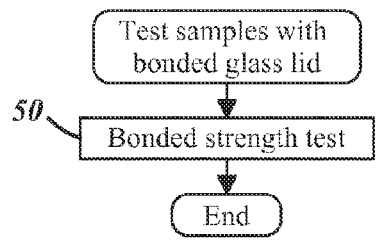
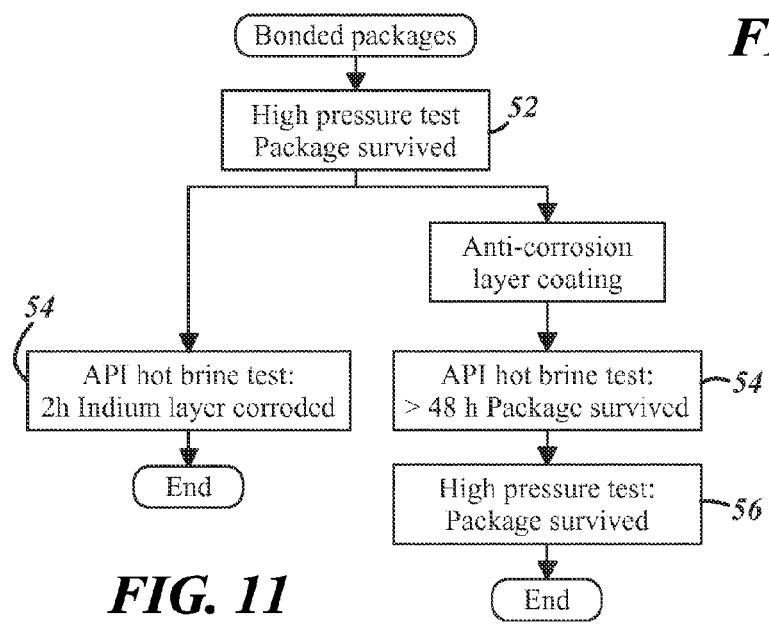
FIG. 11

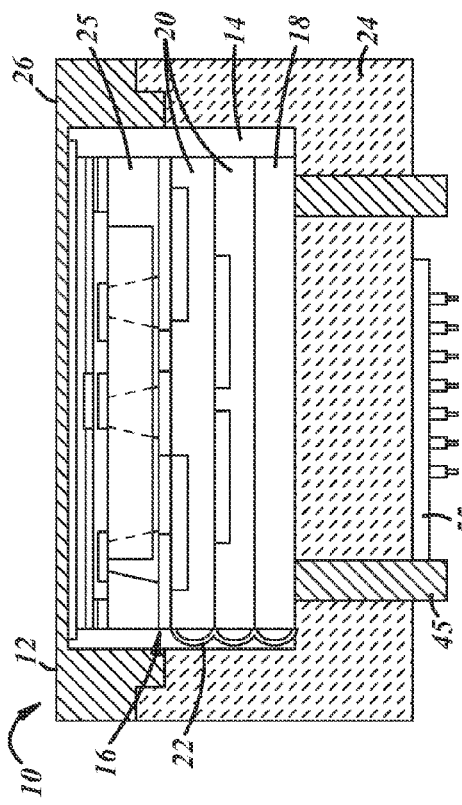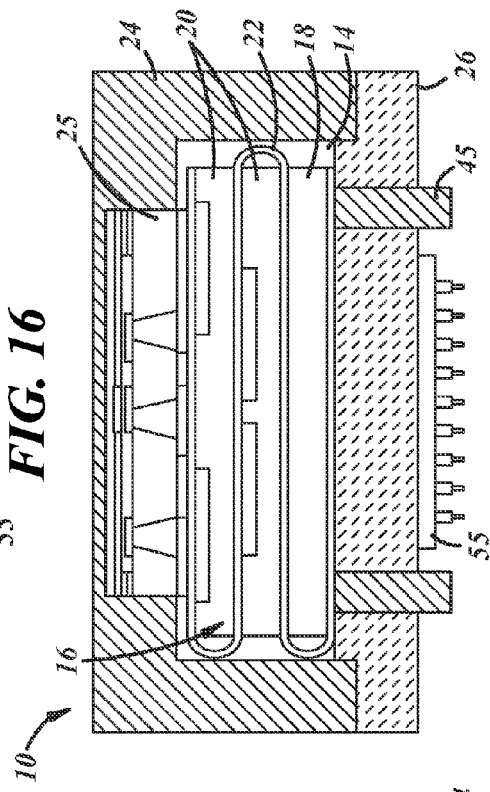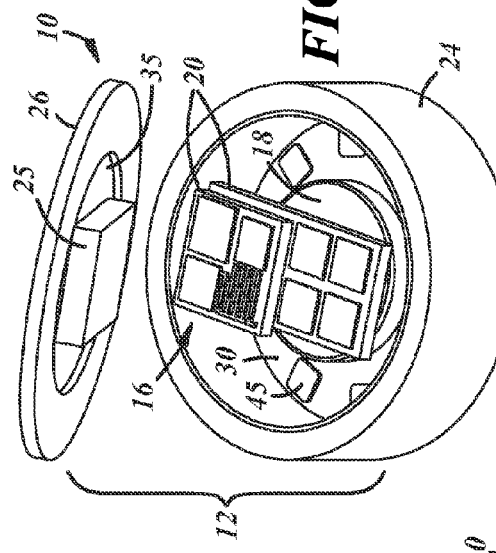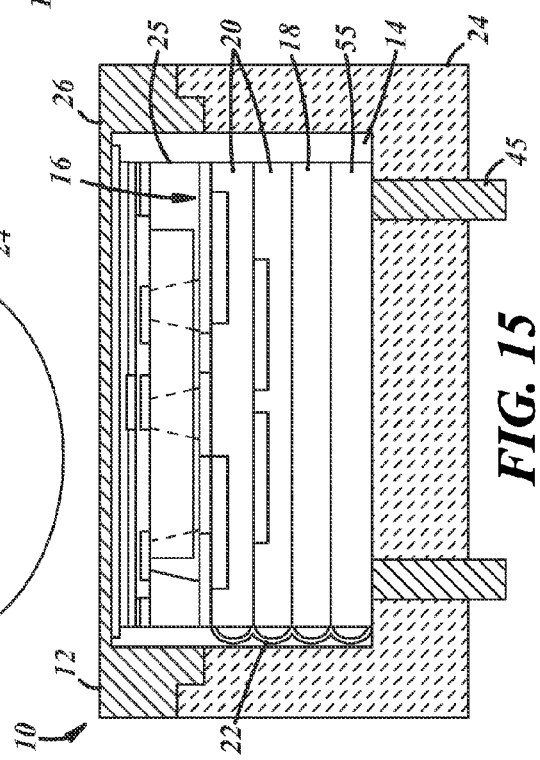

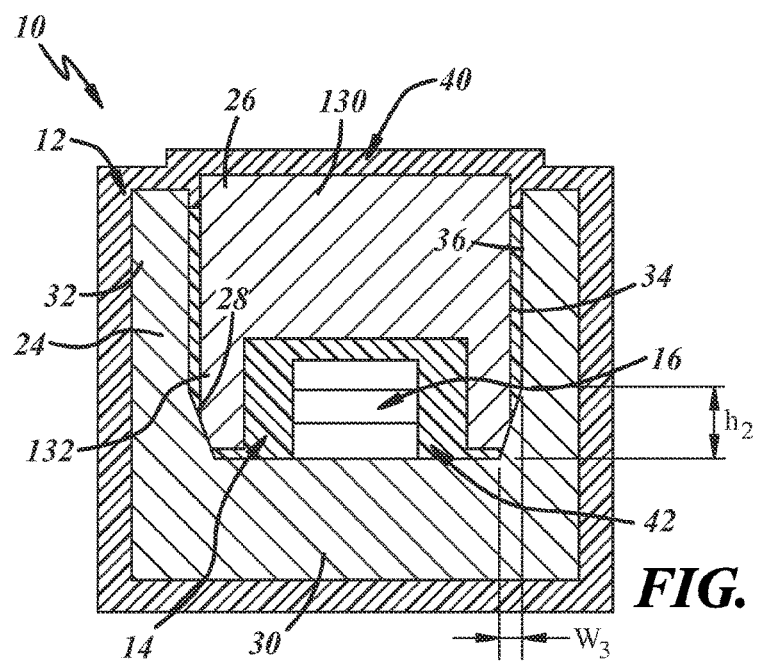
FIG. 25
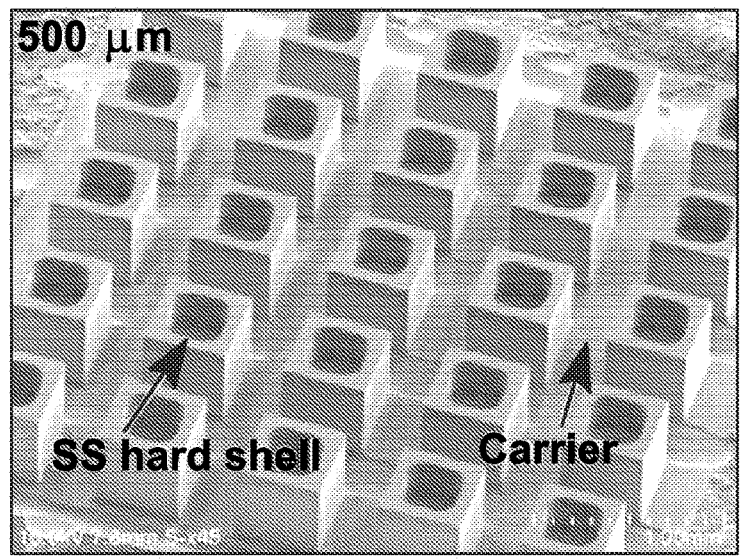
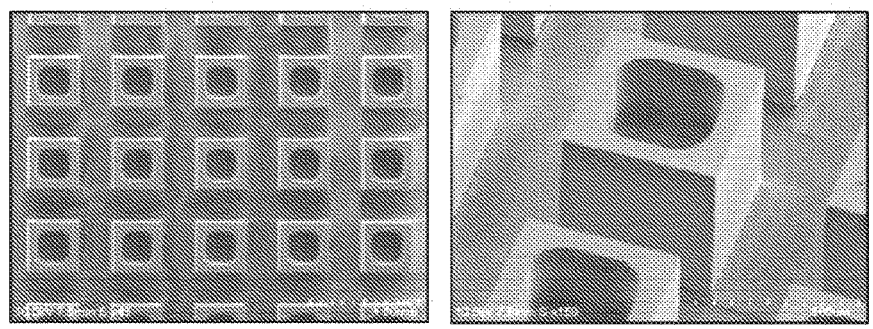
FIG. 27

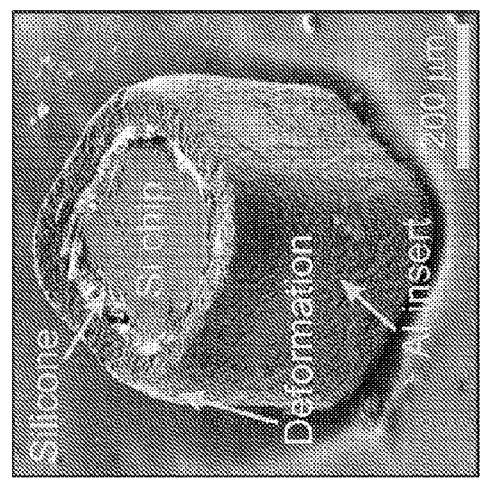
FIG. 29
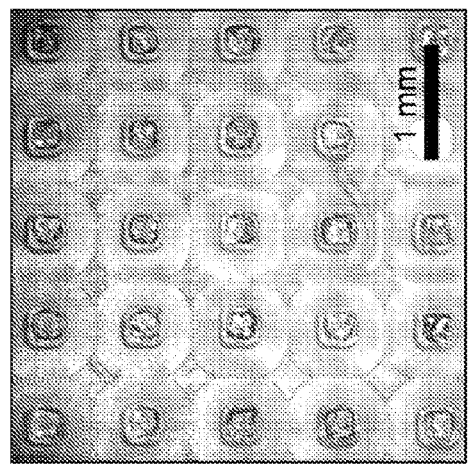
FIG. 30
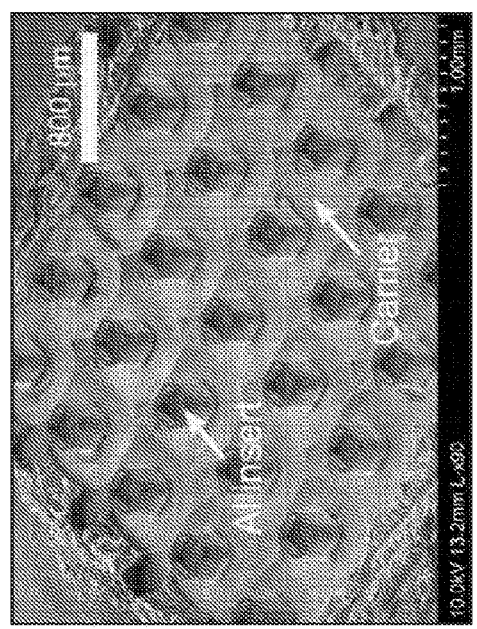
(a)
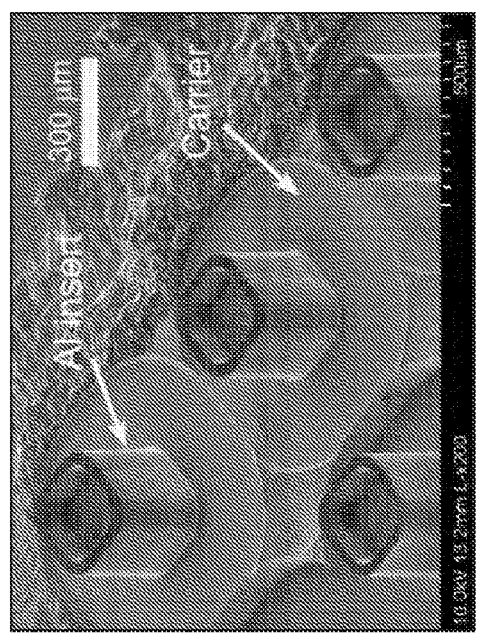
(b)
FIG. 28

PACKAGED MICROSYSTEMS

TECHNICAL FIELD

The present disclosure relates generally to microsystems and, more particularly, to microsystem packaging intended to protect microsystem components from the surrounding environment.

BACKGROUND

Proper packaging of microelectromechanical systems (MEMS) is important to achieve and maintain device performance in target application environments. Microsystem packaging can account for up to 80% of device manufacturing cost and is a factor that has limited the successful commercialization of certain microsystems. Compared to integrated circuit packaging, microsystem packaging can have a higher level of complexity due to the diversity of device types and/or the necessity for such devices to interact with the surrounding environment.

Some microsystem packaging has been adapted from packaging originally developed for integrated circuits. In one example, device chips are released from a wafer, individually attached, wire-bonded, and then encapsulated in standard or customized dual in-line packages, ball grid arrays, etc. Various wafer-level packaging approaches may also be employed. In a typical implementation, the device chips are separated from each other but remain on a carrier wafer. Each chip is then encapsulated at the wafer scale using techniques such as low-temperature solder-based wafer bonding before the packaged chips are diced and ready for use. These techniques can provide adequate protection for microsystems in some environments, and some have been commercialized. However, such packaging is not suitable for use in certain environments (e.g., harsh environments).

Fossil fuel exploration and production is one example of an industry where microsystems, though often desirable for use, have traditionally been unable to withstand the harsh environments present in oil wellbores or hydraulic fractures. Information regarding temperature, pressure, and other variables in such wellbores, hydraulic fractures, and reservoirs is valuable for maintaining quality, efficiency, and safety in the industry. Techniques such as well logging, cross-well imaging, and seismics can provide aggregate information but would be more useful if supplemented by microsystems with data logging capabilities. However, the harsh subterranean environments and size constraints have limited such use of microsystems. To be successfully used in some applications (such as the aforementioned harsh subterranean environments and size constraints), microsystems must withstand high pressures (e.g. 2500-7500 psi) and high temperatures (e.g. 75-125° C.) in high salinity (e.g. 5-15%) or other corrosive fluids. Furthermore, in order for such microsystems to be flushed with proppants into hydraulic fractures and subsequently retrieved, the packaging must be about 1 mm or less at its largest dimension.

SUMMARY

In accordance with one implementation, a method of packaging microsystems includes: (a) providing a plurality of microsystems, a plurality of first micropackage portions, and a plurality of second micropackage portions, at least one of said pluralities being provided in an array on a substrate; (b) placing each of the microsystems between one of the first micropackage portions and one of the second micropackage portions to form a corresponding array of packaged microsystems; and (c) releasing the packaged microsystems from the corresponding array to form a plurality of individual packaged microsystems.

In some embodiments of this implementation, the method includes: forming a trench in a wafer substrate to at least partially define the plurality of microsystems, whereby the plurality of microsystems is provided in the array of step (a); attaching the plurality of first micropackage portions to the wafer substrate so that one of the first micropackage portions is located at each one of the at least partially defined microsystems; and attaching the plurality of second micropackage portions to the plurality of first micropackage portions to form the corresponding array of packaged microsystems of step (b).

In some embodiments of this implementation, the method includes, before step (b), forming a trench in an opposite second side of the wafer substrate to release the microsystems from one another.

In some embodiments of this implementation, the method includes, before step (b), removing the excess thickness of the wafer substrate from an opposite second side of the wafer substrate to release the microsystems from one another.

In some embodiments of this implementation, step (b) includes individually placing each microsystem, each first micropackage portion, or each second micropackage portion into said corresponding array.

In some embodiments of this implementation, step (a) includes providing the first micropackage portions on a carrier substrate in the array of step (a); providing the second micropackage portions on a carrier substrate in the array of step (a); or providing the first micropackage portions on a first carrier substrate in the array of step (a) and providing the second micropackage portions on a second carrier substrate in a corresponding array.

In accordance with another implementation, a method of packaging microsystems includes: (a) locating a microsystem between first and second micropackage portions; and (b) pressing the first and second micropackage portions together, wherein at least one of the micropackage portions is configured to deform during step (b) to seal the microsystem in a cavity formed between the first and second micropackage portions.

In some embodiments of this other implementation, wherein step (a) includes locating a plurality of microsystems between a corresponding plurality of first and second micropackage portions such that each one of the microsystems is sealed in an individual cavity formed between one of the first micropackage portions and one of the second micropackage portions in step (b).

In some embodiments of this other implementation, the cavity includes a filler material supported by one of the micropackage portions before step (b).

In some embodiments of this other implementation, the microsystem is one of a plurality of microsystems and each of the first and second micropackage portions is one of a plurality of first and second micropackage portions, at least one of said pluralities being provided in an array on a substrate before step (a), the method further comprising the step of releasing a plurality of individual packaged microsystems from the array after step (b).

Any of the above listed implementations and embodiments may include one or more of the following features, limitations, or steps in any combination:

forming a trench in a first side of a wafer substrate and partially through the thickness of the wafer substrate in a first direction, and attaching second micropackage portions from an opposite second direction;

attaching first and second micropackage portions together using a bonding material;

attaching first and second micropackage portions together by pressing first and second micropackage portions together and deforming at least one of the first or second micropackage portions;

the first micropackage portions, the second micropackage portions, or both the first and the second micropackage portions include a feedthrough for external communication with the microsystems;

mating surfaces of first and second micropackage portions have interlocking features;

one or both of first and second micropackage portions is configured to be at least partially transparent to electromagnetic radiation;

one or both of the first and second micropackage portions are metal;

one of the first or second micropackage portions is stainless steel;

micropackage portion(s) configured to be at least partially transparent to electromagnetic radiation includes glass, stainless steel, aluminum, brass, or ceramic;

the packaged microsystems each include a pressure sensor and one or both of the first and second micropackage portions is configured to predictably deform in response to external pressure applied to the packaged microsystems;

the packaged microsystems are configured to withstand an external fluid pressure of 50 MPa or greater;

the external dimensions of the packaged microsystems corresponds to a volume of 1 mm$^3$ or less;

the volume corresponding to the external dimensions of the packaged microsystems is in a range from 0.125 mm$^3$ to 0.512 mm$^3$;

the maximum external dimension of the packaged microsystems is less than 1 mm; and a coating is disposed over at least a portion of the outer surfaces of the packaged microsystems, the coating comprising alumina and poly(p-xylylene).

BRIEF DESCRIPTION OF THE DRAWINGS

Illustrative embodiments will hereinafter be described in conjunction with the appended drawings, wherein:

FIG. 6A is a photographic image illustrating a bonding surface of a micropackage portion similar to that of FIG. 5;

FIG. 6B is an interferometer scan of the bonding surface of FIG. 6A;

FIG. 7 is a top view photographic image of an illustrative folded chip-cable microsystem in a micropackage portion similar to that of FIG. 5;

FIG. 8 is a photographic image an illustrative micropackage including a micropackage portion similar to that of FIG. 5 with a closure;

FIG. 9 is a plot of a temperature profile used in an illustrative bonding process including gold-indium transient liquid phase bonding;

FIG. 10 is a top view photographic image of an example of a coated micropackage;

FIG. 11 includes flowcharts depicting micropackage test procedures;

FIGS. 14-20 illustrate various alternative configurations of the packaged microsystem;

FIG. 25 is a cross-sectional side view of an example of the packaged microsystem including a deformable insert;

FIG. 27 includes images of an array of micropackage portions for use in the process of FIG. 26;

FIG. 28 includes images of an array of micropackage portions for use in the process of FIG. 26;

FIG. 29 is an image of the micropackage portions of FIG. 28 with microsystems located at each micropackage portion; and FIG. 30 is an SEM image of a deformable insert after micropackage disassembly.

DESCRIPTION OF THE ILLUSTRATED EMBODIMENTS

Described below is a packaged microsystem that is capable of surviving harsh environments, such as an oil exploration environment. The packaged microsystem includes a microsystem in a micropackage that can be made on a sub-millimeter scale. The micropackage is useful to protect microsystem components, such as sensor chips, electronic chips, photosensors, LEDs, and/or batteries, while maintaining the ability of the microsystem to communicate or interact with the environment outside the micropackage.

Figure 1:
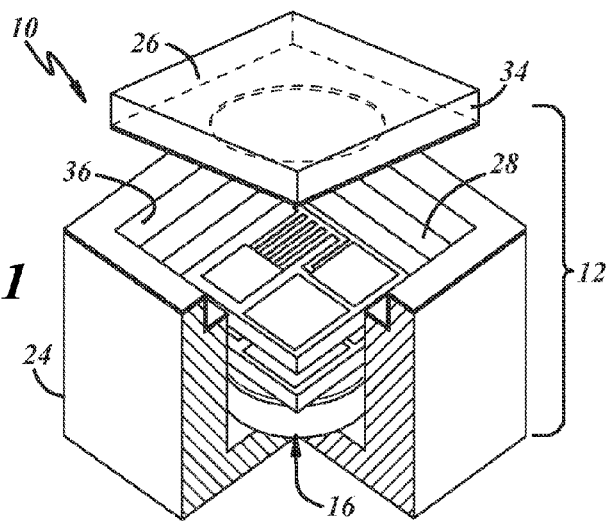
FIG. 1 is an isometric cutaway and partially exploded view of an example of a packaged microsystem.
Figure 2:
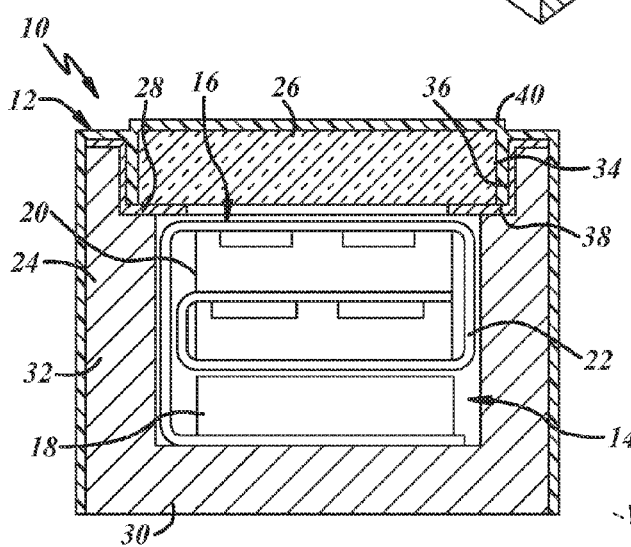
FIG. 2 is a cross-sectional side view of the packaged microsystem of FIG. 1.

FIGS. 1 and 2 illustrate different views of an exemplary packaged microsystem 10. FIG. 1 is a partially exploded cutaway view of the packaged microsystem 10, and FIG. 2 is a cross-sectional side view of the packaged microsystem. The packaged microsystem 10 includes a micropackage 12 with an internal cavity 14 and a microsystem 16 located in the micropackage cavity 14. In this example, the microsystem 16 includes a battery 18 and two electronic chips 20 electrically connected by a flexible and folded interconnect 22. The internal cavity 14 is defined by first and second portions 24, 26 of the micropackage 12 when they are sealed or otherwise attached together as shown, for example, in FIG. 2. The first and second portions 24, 26 are sealed together along one or more bond or sealing surfaces 28 and such that the cavity 14 may be hermetically sealed. Here, the intended bond surfaces 28 are horizontal surfaces at a top side of the cavity 14 (as oriented in FIG. 2) or an open end of the first micropackage portion 24 of FIG. 1, but other bond surfaces may be employed.

The first and second portions 24, 26 of the micropackage 12 may each be made from a different material. One or both of the materials may be metal. Metal materials can withstand temperatures and have yield strengths much higher than polymeric materials and are generally less brittle than ceramic materials. Metal materials are also conducive to micro-electrodischarge machining (μEDM). In one example, the first portion 24 is a metal portion. The first portion of FIGS. 1 and 2 includes a base 30 and a plurality of sidewalls 32 extending from the base so that each of the sidewalls partly defines the cavity 14. A portion of the micropackage with such a structure (i.e., one or more walls shaped to have a hollow or concave side that can be closed off to form a cavity) may be referred to as a shell or can. In one particular example, the first portion 24 is fabricated from stainless steel, which is a particularly useful and cost-effective metal in corrosive environments. Five of the six sides of the illustrated cube-shaped micropackage 12 may thus be metal in the illustrated example, lending high strength and durability to the micropackage.

While metal packaging can have very high temperature, pressure, and corrosion resistance, metal materials can interfere with the ability of the microsystem 16 to interact with the environment surrounding the micropackage 12, depending on the particular application. For example, some metals may have a shielding effect with wireless communication, block other useful wavelengths of the electromagnetic spectrum, or have magnetic properties that affect the operation of certain microsystems. At least a portion of one of the micropackage walls that define the internal cavity 14 may be configured to allow communication between the microsystem 16 inside the micropackage 12 and the external environment. Several examples are subsequently described.

In one example, the second portion 26 of the micropackage 12 is non-metallic. In a particular example, the second portion 26 is made from a glass material (e.g., borosilicate glass). A non-metallic second portion 26 can be transparent to electromagnetic waves, such as RF or visible light, allowing the microsystem 16 to receive and/or transmit wireless signals and power through the sealed micropackage 12. The generally flat configuration (i.e. no sidewalls) of the illustrated second portion 26 may be referred to as a closure or lid. Where an outer perimeter 34 of the second portion 26 nests within an inner perimeter 36 of the first portion 24, the second portion may also be referred to as an insert.

The packaged microsystem 10 may also include a bond layer 38 that bonds and/or seals the first and second portions 24, 26 together, as well as a coating 40 disposed over at least a portion of the outer surface of the micropackage 12. In some embodiments, the coating 40 is disposed along at least a portion of an interface between the first and second portions 24, 26 and may function to protect the bond layer 38 from corrosion, if necessary. Examples of suitable bond layers 38 and coatings 40 are given below.

The micropackage 12 of FIGS. 1 and 2 has a square footprint, which can allow for more efficient use of the internal volume of the cavity 14, particularly with microsystems 16 that include electronic chips 20, which are usually square or rectangular. The micropackage 12 could also have a circular, elliptical, or some other curvilinear footprint, or could be spherical or ellipsoidal. Curved features could minimize stress concentration in the structure and/or provide the micropackage with a better tendency to roll in the target environment.

A working example based on the embodiment of FIGS. 1 and 2 has been mathematically modeled and fabricated. In the working example and simulation described below, the first portion 24 of the micropackage 12 is a metal can made of stainless steel (SS) 17-4 PH, and the second portion 26 of the micropackage is a lid made of borosilicate glass. The SS17-4 PH provides high yield strength, while the transparency of the borosilicate glass allows RF or optical communication through the micropackage. Typical properties for these two materials are listed in Table I below.

TABLE I

|  | SS 17-4 PH | Borosilicate |
|---|---|---|
| Density (g/cm$^3$) | 7.75 | 2.53 |
| Strength (MPa) | 760-1100 (Yield) | 20-200 (Tensile) |
| Young's Modulus (GPa) | 200 | 77.5 |
| Long-Term Usage Temperature (° C.) | <1400 | <500 |

With most of the walls of the micropackage 12 constructed from metal, the micropackage is much more durable than the glass or ceramic packaging typical in electronics packaging, particularly under high pressures. In a non-limiting example, the outer dimensions of the micropackage 12 are 0.8×0.8×0.8 mm$^3$, and the inner dimensions of the cavity 14 are 0.4×0.4×0.45 mm$^3$. These particular exemplary dimensions are based in part on the finite element analysis (FEA) described below, but can be increased, decreased, or otherwise modified as necessary or as desired.

The approach selected for integration of microsystem 16 components in the modeled and fabricated micropackage 12 includes a flexible cable 22 that provides electrical interconnections among the battery 18, electronic chips 20, and sensor chips or other microsystem 16 components. The cable-component assembly is folded into a stack for integration into the micropackage 12, similar to FIG. 2. This approach allows easy and reliable attachment of the microsystem components to the cable 22 in a planar form before folding, and provides structural robustness.

The micropackage 12 was modeled under a simulated 50 MPa external pressure using COMSOL® Multiphysics 4.3 (commercially available from Comsol, Inc., Burlington, Mass., USA). The modeling was used to help determine the minimum wall thickness for given exterior dimensions, and therefore the maximum dimensions for the inner cavity 14. The modeling also helped identify the magnitude and location(s) of the maximum deformation of the micropackage 12 under the target pressure with the selected dimensions.

Figure 3:
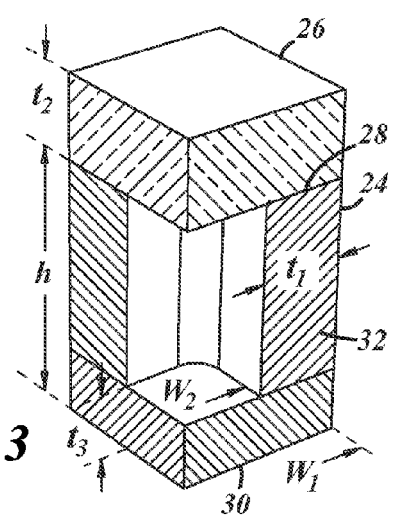
FIG. 3 is an isometric view of a quarter-model of a micropackage used in FEA simulations.

FIG. 3 illustrates the simplified quarter-model geometry used for modeling the micropackage 12. The minimum wall thickness $t_1$ is limited by the maximum stress in the first micropackage portion 24 under the target pressure. A safety margin between the maximum simulated stress and the yield strength of the material may be used to account for the simulation being an approximation and for the fact that many other factors could affect the real geometry (e.g., machining precision) and material properties (e.g., defect, temperature change, etc.).

Figure 4:
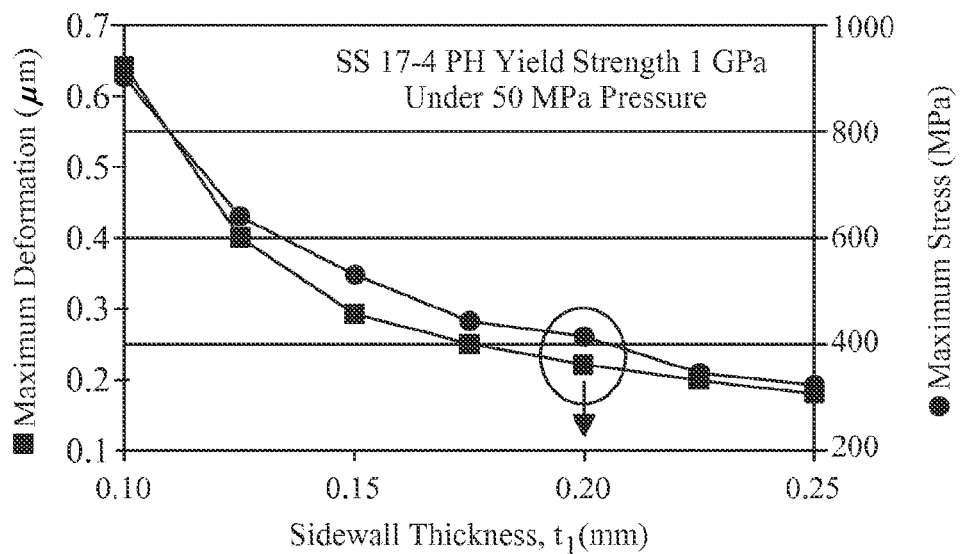
FIG. 4 is a plot of simulation results based on the model of FIG. 3.

FIG. 4 is a plot of predicted maximum deformations and stresses for various sidewall thicknesses $t_1$ under an external pressure of 50 MPa. Using a safety factor (ratio of yield strength to maximum stress) of 2.4, the dimensions selected for the working model is circled in FIG. 4 and includes a wall thickness $t_1$ of 0.20 mm for the first portion 24 of the micropackage 12. The maximum stress for this wall thickness $t_1$ is 416 MPa, and the maximum deformation is 0.22 μm. With reference to FIG. 3, to form a micropackage 12 with an external width $W_1$ of 0.8 mm, the internal cavity 14 has an internal width $W_2$ of 0.4 mm.

The thickness $t_2$ of the second portion 26 (i.e., the glass lid) was matched to the thickness $t_1$ of the sidewalls 32 of the first portion 24 (i.e., the metal can). The adequacy of this thickness $t_2$ was verified experimentally, considering the limited effectiveness of strength simulations for brittle materials. Different lid materials such as higher strength glass or ceramics could also be used. To maintain a cube-shaped micropackage 12, the height h of the first portion 24 from the exterior side of the base 30 to the bond surface 28 is 0.6 mm, which may include a base 30 thickness $t_3$ of 0.20 mm to arrive at a cube-shape cavity 14. In another example, the base 30 thickness is 0.15 mm.

Metal cans 24 were fabricated using μEDM with a 125 μm diameter rotating tungsten electrode wire as the cutting tool. During μEDM, the discharge energy, and thus the material removal rate and finish of the machined surface, is a function of the applied voltage and a capacitor. Lower voltage or smaller capacitance generally results in a lower material removal rate but better surface finish. The capacitance was 3.3 nF for machining steps, and 10 pF for polishing steps performed along the bond surfaces 28. The voltage was 80 V in both cases.

Figure 5:
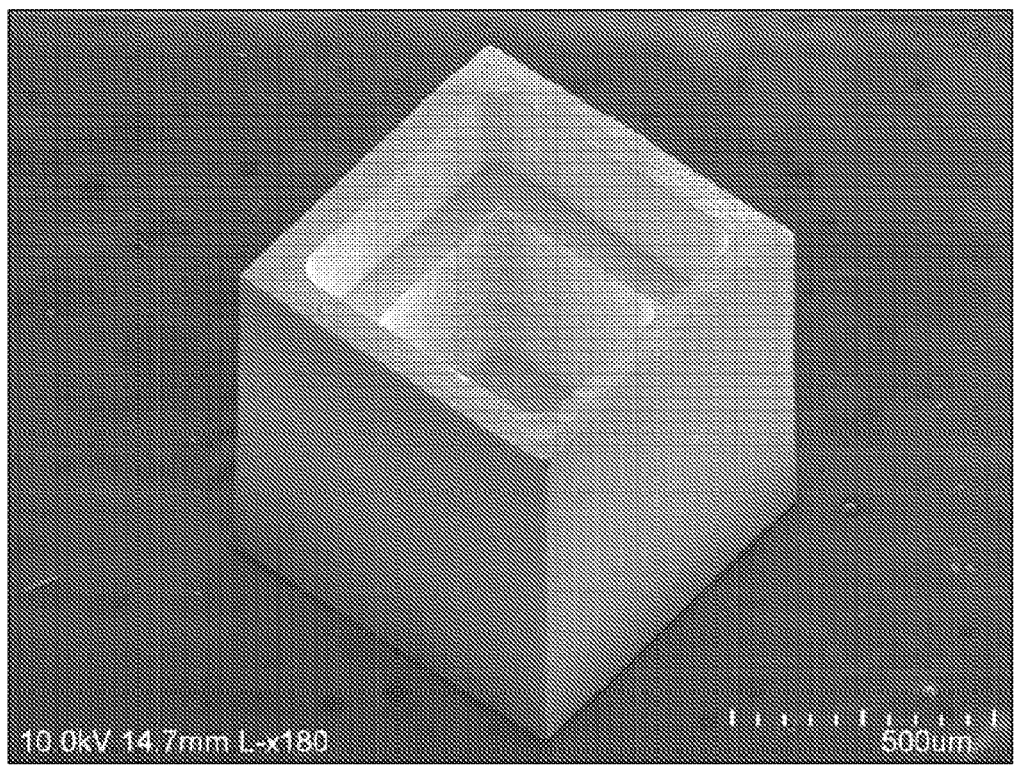
FIG. 5 is an SEM image of an illustrative micropackage portion.

FIG. 5 is an SEM image of a machined metal can (i.e., first portion 24). FIGS. 6A and 6B are top view images of the metal can after the smaller discharge energy polishing step. FIG. 6A is a photographic image, and FIG. 6B is an interferometer scan. The area roughness ($S_a$) of the bond surface is <100 nm, and the height variation is <1 μm, according to characterization provided by the interferometer (LEXT®, Olympus Corporation, PA, USA). Glass lids were formed by cutting VWR® cover glasses (Model No. 2 with ≈0.2 mm thickness) into 560×560 μm² pieces using an ADT 7100 dicing saw.

Dummy silicon (Si) chips were used to demonstrate the integration of electronic and sensor chips (i.e., microsystems) in the micropackage 12 using a folded flexible cable 22. The dummy chips were made by thinning a Si-wafer to 100 μm thick, and then cutting it into 300×300 μm² squares. Both steps were performed by deep reactive ion etching (DRIE). Metal pads and leads were formed on the Si-wafer by lift-off of evaporated Cr/Au/In (20/100/1000 nm) before the thinning step. The flexible cables 22 were made from polyimide (HD Microsystems PI-2611). For microsystem 16 assembly, the flexible cables 22 and chips 20 were aligned and bonded via an Au—In bond formed at 180° C. and 18 MPa with the cable in a flat configuration.

FIG. 7 is a top view of a fabricated metal can 24 with an inserted chip-cable assembly (simulated microsystem 16) before the glass lid closure is in place. FIG. 8 is a top/side view of a fabricated metal can 24 with the glass lid 26 in place, but not yet bonded or sealed to the metal can.

Gold-Indium (Au—In) transient liquid phase (TLP) bonding was used to bond and seal the glass lid 26 to the metal can 24. Au—In TLP bonding has a relatively low bonding temperature compared to some other bonding techniques. 70 wt % In was used in this particular example, but In content may range from 13-90%. Although an In-rich bond (>54 wt % In) has a lower re-melting temperature (156° C.), the excess indium can help relieve stress generated between bonded parts and can also reflow to compensate for roughness and/or unevenness of the bond surfaces.

The bond layer 38 in this example included a 100 nm layer of palladium (Pd) to promote adhesion, a 300 nm layer of Au, and a 2000 nm layer of In on the bond surface 28 of the metal can 24 and the corresponding bond surface of the glass lid 26. The thin film metal layers of the bond layer were deposited by evaporation. The 4 μm total thickness of indium was considered adequate to planarize the bond surface 28 of the metal can 24, which had topographical variations of <1 μm, as noted above. The resulting weight percentage of indium was 71.6% as fabricated. In order to provide a transparent window on the glass lid after bonding, sacrificial material (e.g., photoresist) was placed in the center of the glass lid before the deposition of Pd/Au/In layers and subsequently dissolved in acetone to lift off the center portion of the metal layers. The metal and glass portions 24, 26 of the micropackages 12 were bonded under vacuum (≈50 mTorr) with a bonding pressure of about 10 MPa at 200° C. for 2 hours. The bonding pressure was applied using a customized fixture. FIG. 9 shows the temperature profile used during bonding.

After the metal and glass components 24, 26 of the micropackage 12 were bonded, a coating 40 was applied to the exterior of the micropackage. The coating 40 in this example was a multi-layer coating, including a layer of alumina ($Al_2O_3$) and an overlying layer of Parylene®-C. The coating 40 was applied to help prevent corrosion of the indium of the bond layer 38 when exposed to the hot brine environment encountered in some oil well applications. Atomic layer deposition (ALD) alumina is a pin-hole free thin material, and Parylene-C is a stable polymer that does not react with most chemicals at the room temperature. The two layers together are believed to provide corrosion resistance better than either layer alone. The alumina under-layer is believed to improve the adhesion of the Parylene-C layer. Parylene-C is one of a family of poly(p-xylylene) polymers. In particular, Parylene-C is a chlorinated poly(p-xylylene) with a chlorine atom attached to the aromatic ring in the repeating unit. As used herein, poly(p-xylylene) includes chlorinated, halogenated, or any other functionalized versions of poly(p-xylylene) and its copolymers or alloys.

A layer of alumina with a thickness of about 220 nm was deposited on the sealed micropackages 12 using thermal ALD at 150° C. with an Oxford™ Instruments OpAL and 2000 deposition cycles. The packages 12 were then coated with an adhesion promoter (e.g., Silane A174), which was deposited in the vapor phase. Following this, a 12.8 μm thick layer of Parylene-C was deposited by a PDS 2035 Parylene Deposition System (Specialty Coating Systems, Indianapolis, Ind.). A top view image of a sealed and coated micropackage 12 (i.e., the packaged microsystem 10) is given in FIG. 10.

Sealed micropackages 12 were subjected to a series of high pressure, high temperature, and corrosion tests until failure. In addition, the shear strength of the bond between the cans 24 and lids 26 was tested. The sequence of tests conducted is shown in FIG. 11.

The shear strength of the Au—In bond used to attach the glass lid 26 to the metal can 24 was evaluated at step 50. Test samples were prepared by bonding glass lids 26 to a SS17-4 PH substrate using the same bonding conditions as for the actual micropackages 12. Shear strength tests were performed using a force gauge to determine the lateral force necessary to detach the bond. This force was divided by the 0.3136 mm² bond area to determine the shear strength. The average shear strength was about 13 MPa. Visual inspection under an optical microscope indicated that the bonds tended to break within the indium layer of the bond layer 38.

Figure 12:
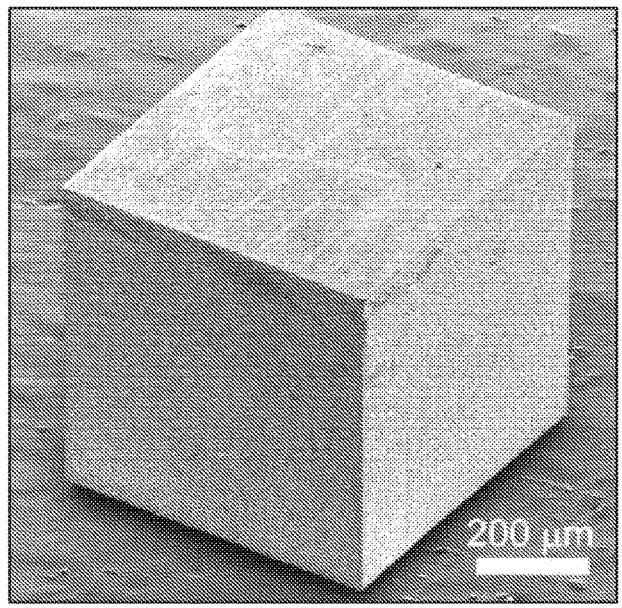
FIG. 12 is an SEM image of a micropackage after high pressure testing.

The micropackages 12 were subjected to high pressure testing at step 52 before deposition of the anti-corrosion coating 40. In this test, an Enerpac™ hydraulic pump P142 was used to subject the micropackages 12 to a 50 MPa hydraulic pressure in an oil-filled test chamber for five minute intervals. Before high pressure testing 52, each micropackage was soaked in water for at least 4 hours to evaluate the seal for gross leakage. Leaking micropackages were not used in pressure testing 52, as they would have been less likely to show mechanical deformation in the high pressure testing 52 due to hydraulic fluid entering the micropackage cavity and equalizing the pressure. Water leaks were visually detected by condensation on the cavity side of the glass lids 26. An SEM image of a micropackage 12 after high pressure testing 52 is shown in FIG. 12 (glass side down). Neither mechanical deformation nor leakage of hydraulic fluid into the micropackages 12 was observed after the pressure testing.

The micropackages 12 were then tested in brine at 80° C. at atmospheric pressure at step 54. The brine composition was 8 wt % NaCl and 2 wt % $CaCl_2$ in deionized water (often referred to as API standard brine), in accordance with American Petroleum Institute (API) test standards. Some of the packages were coated with 0.22 µm ALD $Al_2O_3$ and 12.8 µm Parylene-C before being subjected to the API hot brine test, and some of the packages remained uncoated for the hot brine test. Visual inspection was performed hourly during the first 4 hours of the test, then every 2 hours until 24 hours elapsed, and then every 4 hours until 48 hours elapsed. The coated micropackages were subjected to a second high pressure test at step 56 after hot brine testing to assess whether the hot brine test compromised the bond between the can and lid.

Figure 13:
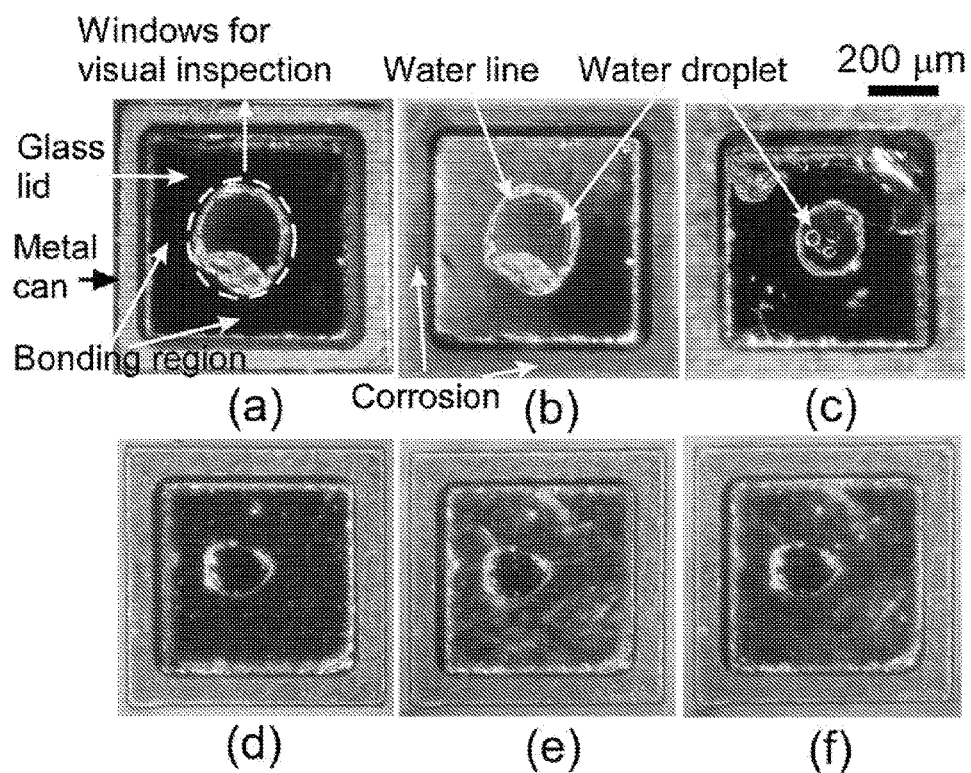
FIG. 13 includes top view photographic images of various micropackage test samples.

FIG. 13 includes top-view photographic images of micropackages subjected to various test conditions. FIGS. 13(*a*)-13(*c*) respectively show uncoated micropackages: untested, after 2 hours of hot brine testing, and after the 4 hour water soak lead test. FIGS. 13(*d*)-13(*f*) respectively show coated micropackages: untested, after 48 hours of hot brine testing, and after the subsequent 50 MPa pressure test. The coated micropackages showed no sign of corrosion of the indium layer at the top surface of the metal can, and no water droplets were evident in the window of the package. The uncoated micropackages encountered water leakage and the glass lid easily separated from the metal can with gentle rubbing. After the 50 MPa/5-minute high pressure test was performed on the coated micropackages after the hot brine testing, the metal can and glass lid remained intact, and the bond remained unbroken. In these particular working models, the alumina/Parylene coating was not applied to the bottom side (opposite the glass lid) of the micropackages, but in some embodiments, the coating 40 is applied over the entire exterior surface of the micropackage.

The above-described fabricated micropackages are merely illustrative. For instance, the lower limit on the size of the inner cavity of the micropackage is limited by the forming technique, which is about 5 µm for µEDM. Alternative techniques such as laser machining may generate smaller features, though the machined structures may be subject to higher thermal stress. Smaller safety factors could also be used in the design, leading to thinner walls and an accompanying increase in cavity size and/or decrease in overall micropackage size.

Although serial mode µEDM was used in the above-described fabrication for fast prototyping, a batch-mode µEDM method using lithographically-defined EDM electrodes can be applied for high throughput production and potentially lower unit cost. In batch-mode µEDM, high aspect-ratio microstructures with patterns defined by lithography on a silicon substrate are used as a cutting electrode. The entire pattern can be transferred to the workpiece in one machining cycle, resulting in multiple pieces fabricated in parallel.

Alternatives to the above-described Au—In bonding include other types of eutectic bonds that take advantage of the low temperatures associated with using eutectic mixtures. Brazing techniques are also possible, where a ceramic portion may be metalized so that the braze alloy flows between the portions being bonded during the brazing process. Laser welding, adhesive bonding (e.g., epoxy), and diffusion bonding are some of the other alternatives.

In some embodiments, the packaged microsystem 10 includes microsystem 16 components mounted to the exterior of the micropackage 12. Such embodiments may include electrical feedthroughs or vias in the glass lid 26 or some other wall 30, 32 of the micropackage. Such feedthroughs, which at some point in the fabrication process may be in the form of holes or openings formed through a wall of the micropackage, may be additionally useful to provide access to microsystem components in the micropackage cavity 14 for pre-deployment testing and calibration. Holes may be formed through a non-metal portion of the micropackage 12 (e.g., by laser drilling or etching), then filled and/or electroplated to provide an electrically conductive path between the micropackage cavity 14 and the outside of the micropackage 12. Several additional embodiments including such feedthroughs and other features are illustrated in subsequent figures and briefly described below.

In the embodiment of FIG. 14, the packaged microsystem 10 includes a micropackage 12 with a circular footprint, including a shell or can 24 and a closure 26. In this example, the microsystem 16 includes a battery 18, circuit chips 20, and a pressure sensor chip 25, though other components may be included or substituted. The closure 26 includes a central portion 35 that functions as a diaphragm for the pressure sensor 25. This portion 35 of the micropackage 12 may be configured to predictably deform in response to external pressure applied to the packaged microsystem 10 to work in conjunction with the pressure sensor 25. The micropackage 12 also includes feedthroughs 45 in the base 30 or other wall that can be used for communication or interaction of the sealed microsystem 16 with the external environment or with an external portion of the microsystem. The microsystem 16 may also include a temperature sensor, a chemical sensor, or other type of sensor. In one example, the first portion 24 of the micropackage 12 is made from a ceramic material and the second portion 26 is made from a metal (e.g., stainless steel).

FIG. 15 is a cross-sectional side view of the packaged microsystem 10 of FIG. 14, additionally showing a chemical sensor substrate 55 in the internal cavity 14 of the micropackage 12 and a flexible electrical interconnect 22 that interconnects the various microsystem components. The illustrated feedthroughs 45 provide an interface between the internal chemical sensor 55 and the exterior of the micropackage 12.

FIG. 16 is a cross-sectional side view of an example of the packaged microsystem 10 similar to that of FIG. 15. In this example, the microsystem 16 includes an externally mounted nanowire-based chemical sensor 55 configured to communicate with the internal components 18, 20 of the microsystem 16 via an electrical feedthrough 45 in the ceramic base.

FIG. 17 is a cross-sectional side view of an example of the packaged microsystem 10 similar to that of FIGS. 15 and 16. In this example, the metal portion is the shell or can 24 and the ceramic portion is the closure 26. This example includes a flexible electrical interconnect 22 in a folded configuration as described above in the working model. This embodiment also includes an externally mounted chemical sensor 55.

Figure 19:
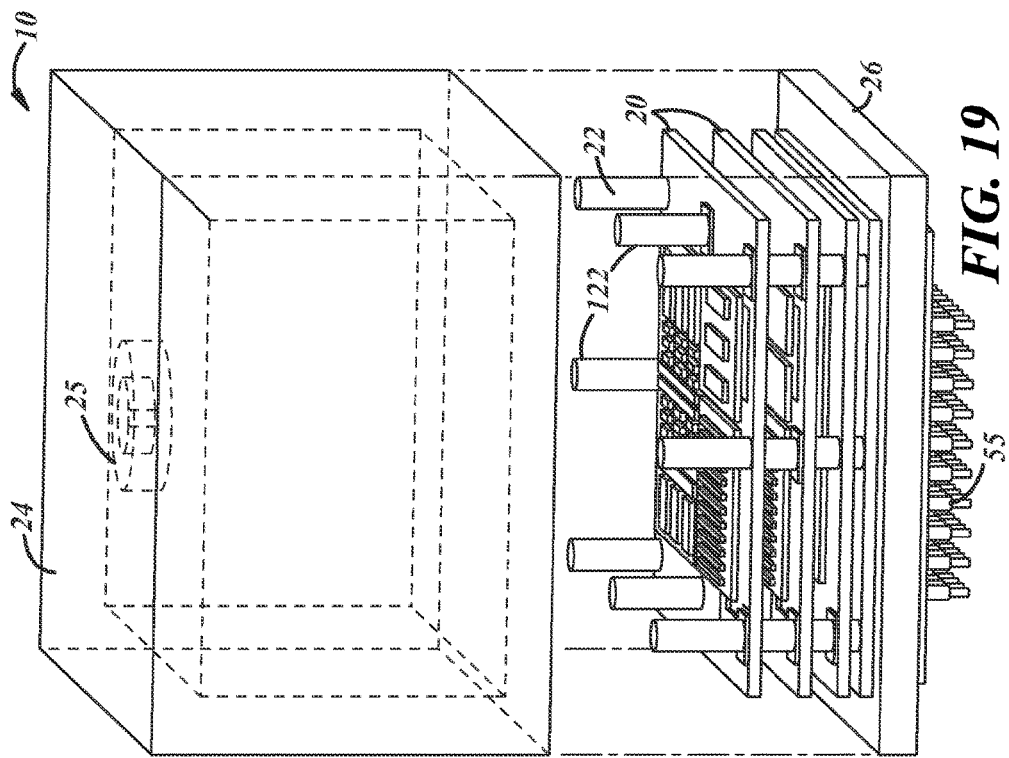
Figure 18:
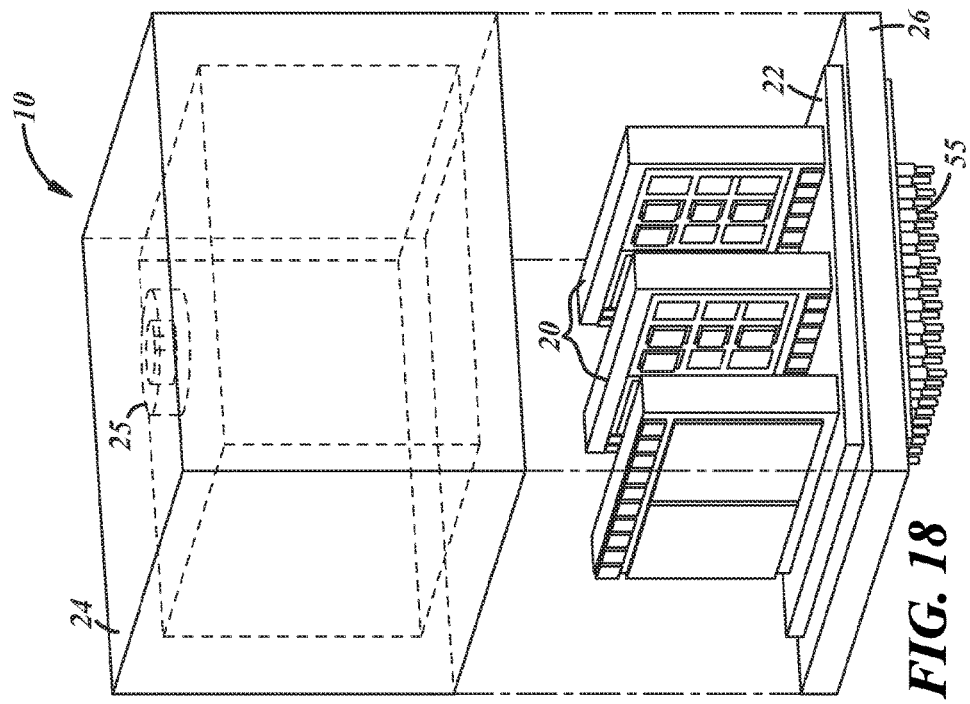
Figure 20:
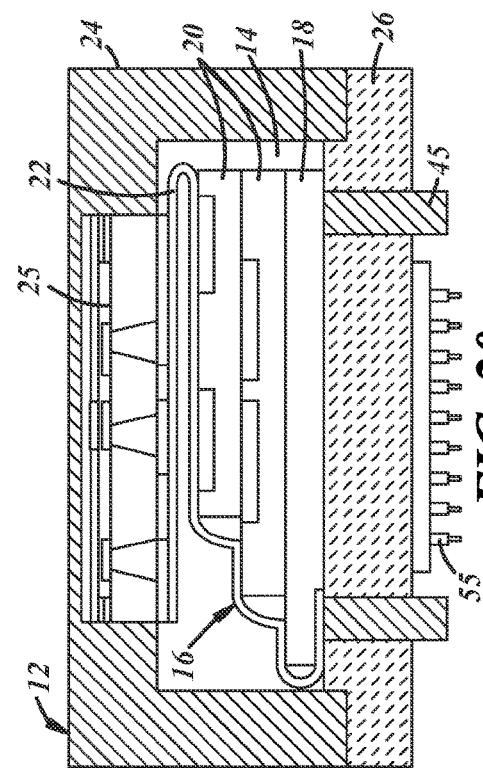

FIGS. 18-20 illustrate examples of alternatives to the folded cable interconnect. The packaged microsystem 10 of FIG. 18 employs a plug-in style electrical interconnect 22, with edges of individual microsystem components 20 in electrical contact with a common conductive layer. This configuration allows for self-alignment of the components 20 and more complex electrical routing. This alternative may require more complicated fabrication, and connection of the pressure sensor 25 with other microsystem components may also be more complex.

The packaged microsystem 10 of FIG. 19 employs a pin-hole stack electrical interconnect 22, with metal or other conductive pins 122 extending through each microsystem component 20 to interconnect them. This configuration allows for self-alignment of the components 20, and lower connection resistance. The chips 20 may require openings to accommodate the pins 122.

The packaged microsystem 10 of FIG. 20 employs a staircase cable interconnect 22, which is a relatively simple structure similar to staircase wirebonding. It is mechanically robust and provides interconnection with the illustrated pressure sensor 25, much like a folded cable configuration. The efficiency of use of the available volume of the cavity 14 may be low compared to other embodiments, and the interconnect bonding is not all in the same plane.

Figure 22:
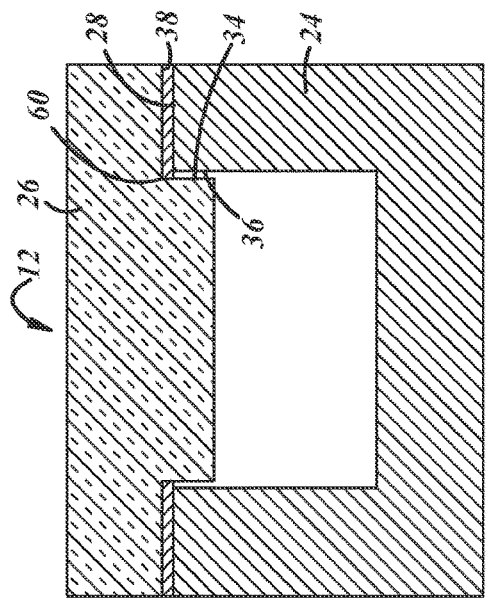
FIGS. 21-23 illustrate various bond surface configurations of the micropackage.
Figure 21:
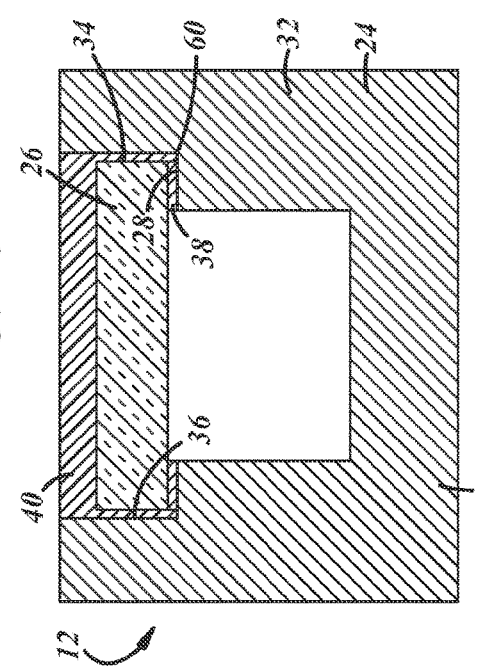
Figure 23:
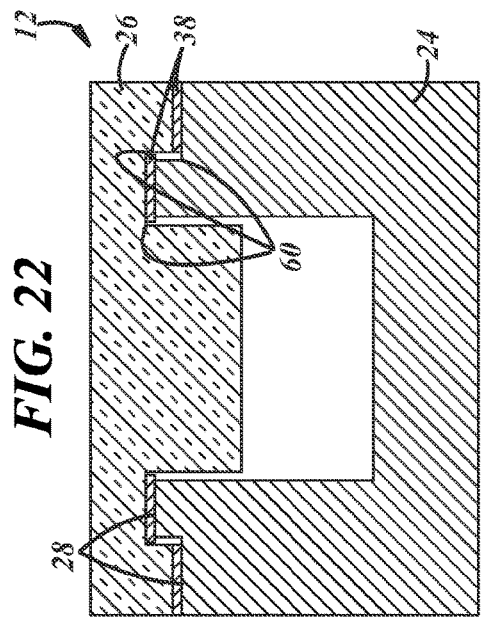

FIGS. 21-23 illustrate alternative configurations for the bond surfaces 28 of the first and second portions 24, 26 of the micropackage 12. The micropackage 12 of FIG. 21 includes a step shape 60 on the inside of the sidewalls 32 of the first portion 24, similar to that in the above-described working models. The step shape includes the bond surface 38 circumscribed by the inner perimeter 36 of the first portion 24. The second portion or closure 26 nests in the resulting counterbore-like feature with the outer perimeter 34 of the closure opposing the inner perimeter 36 of the first portion 24. This example also includes a coating 40. In embodiments with a transparent closure 26 (e.g., glass), the coating 40 may be selected to help maintain the transparency of the closure and protect the bond 38 from corrosion. One suitable material for the coating 40 is a silicone material, which can be made at least partially transparent. In this example, the coating 40 covers the closure 26 and may extend between the respective perimeters 34, 36 of the micropackage portions 26, 24.

The micropackage 12 of FIG. 22 includes a step-shape 60 on the second portion or closure 26, illustrated as a non-metal portion (i.e., glass). In this case the bond surface 28 of the first portion 24 circumscribes the inner perimeter 36 of the first portion, in which the outer perimeter 34 of the closure 26 nests. The micropackage 12 of FIG. 23 includes multiple step features 60 formed in both of the first and second portions 24, 26 to provide multiple bond surfaces 28.

FIGS. 24A-24E illustrate steps of an example of a wafer-level packaging process for monolithic microsystems. This technique can be used as a batch-mode fabrication process to efficiently produce large numbers of packaged microsystems 10. As shown in this cross-sectional sequence, first and second portions 24, 26 (e.g., a stainless steel/metal portion and a ceramic portion) of each micropackage 12 can be bonded and sealed together within openings or cavities etched or otherwise formed through a silicon wafer substrate 16', with a functional portion 16 of the wafer enclosed in each sealed micropackage 12.

Figure 24A:
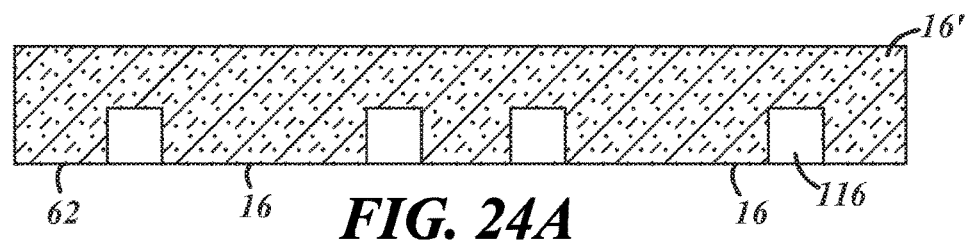
FIGS. 24A-24E depict an illustrative batch process for fabricating multiple packaged microsystems.

The illustrated batch process begins with a wafer substrate 16' that includes an array of microsystems or device regions 16 to be packaged. Additional device layers and/or functional components may be attached to the wafer 16' at the device regions 16. As shown in FIG. 24A, the microsystem portions 16 of the wafer are partially defined by dicing the wafer 16' only partially through its thickness. In one example, deep reactive ion etching (DRIE) is used to form one or more trenches 116 that define the perimeter of each microsystem 16 on a first side 62 of the wafer 16'.

Figure 24B:
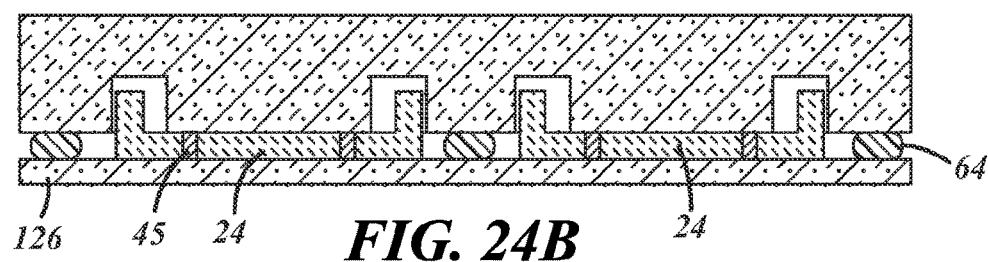

Separately, an array of first micropackage portions 24 is formed or assembled on a carrier wafer 126, as shown in FIG. 24B. For example, glass or ceramic bases 24 may be formed. The first portions 24 may optionally include a recess that defines a portion of the final cavity 14 of each of the micropackages, as shown, or they may be flat—in which case the trenches 116 may be omitted from the substrate 16'. The first portions 24 may be fabricated individually and then assembled into the array on the carrier wafer 126, or they may be microfabricated directly on the carrier wafer. Fabrication options for these portions 24 include subtractive processing techniques such as grinding, laser machining, and ultrasonic machining at the macro or micro scale, as well as additive processes such as molding or reflowing. The array of first portions 24 may also be made from a ceramic substrate in batch mode using plasma based etching, batch mode ultrasonic machining, etc. The illustrated first portions 24 include feedthroughs 45 as described above to facilitate external communication with the microsystem 16 in the finally packaged device.

As illustrated in FIG. 24B, the array of first portions 24 is aligned and inserted into the trenches 116 in the wafer 16'. An adhesive 64 or other joining technique is used to attach the carrier wafer 126 and the device wafer 16' together, effectively attaching the first micropackage portions 24 to the device wafer 16'.

Figure 24C:
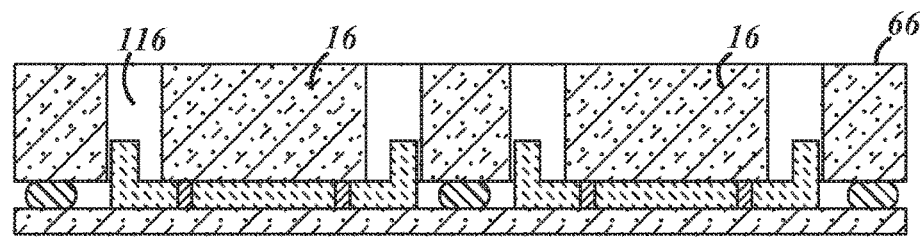

Wafer dicing may be completed as illustrated in FIG. 24C from an opposite second side 66 of the wafer 16', further defining the individual microsystems 16 and providing access to the first micropackage portions 24 from the opposite side 66 of the wafer. For example, a second DRIE step may be performed to form through-wafer trenches 116 and expose the perimeters of the first portions 24 at the second side 66 of the wafer 16'.

Another array of corresponding second micropackage portions 26 is formed on a second carrier wafer 136. In this example, the array includes metal (e.g., stainless steel) caps 26, but the individual micropackage portions 26 could be glass, ceramic, another metal, or other suitable material. These caps 26 can be made individually and then assembled into the array, or a batch mode technique can be used to fabricate the array of caps on the second carrier wafer 136. Machining techniques at the macro or micro scale can be used, including milling, laser drilling, pressing/forming, etc. A batch mode metal processing technique, such as batch mode µEDM, may also be used.

Figure 24D:
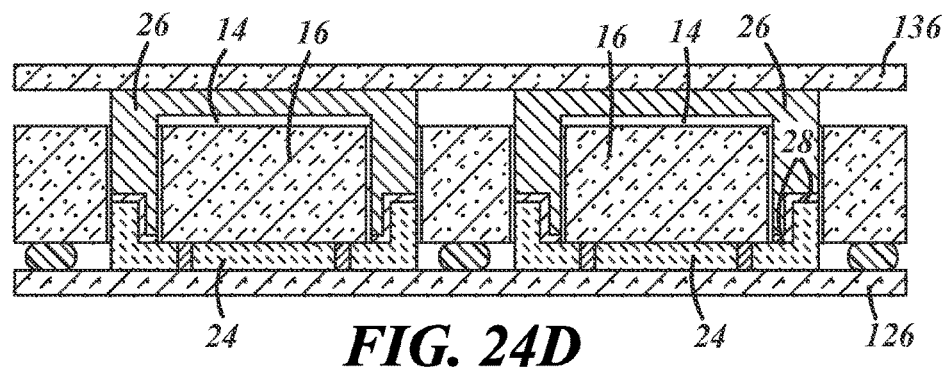

As shown in FIG. 24D, the arrays of first and second micropackage portions (i.e., bases and caps) 24, 26 are sealed and/or attached together to form an array of cavities 14 between each individual pair of micropackage portions 24, 26, with a microsystem 16 sealed in each cavity 14. Interlocking features, such as the illustrated step shape, may be used to increase the surface area of the bond surface(s) 28 or increase the mechanical strength of the attachment. Solder or some other suitable bonding material may be disposed on the bond surface(s) 28 of the first portions 24 through the trenches 116 from the second side 66 of the wafer (i.e., on the subassembly of FIG. 24C before placement of the second portions 26 of the micropackages in FIG. 24D). Additionally or alternatively, the bonding material may be disposed on the mating surface of the second portions 26 prior to bonding Bond layer 38 is thereby formed between the first and second portions 24, 26 when assembled together. In this example, the second portions 26 are inserted through the trenches 116 from the second side of the wafer 16' in a direction opposite from the direction the trenches 116 were initially formed in the wafer 116. Any of the above-described eutectic bonding techniques may be used. Other bonding techniques include diffusion bonding and adhesive bonding.

Figure 24E:
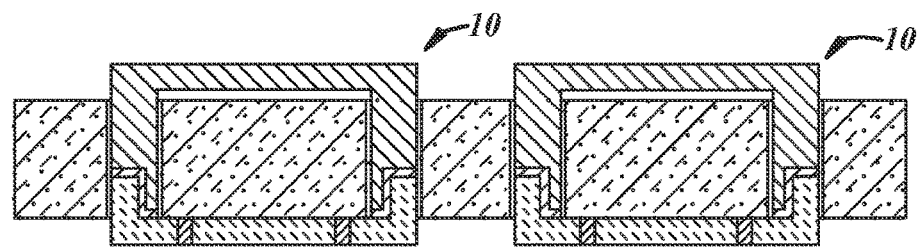

As shown in FIG. 24E, the carrier wafers 126, 136 may be removed to release the individual packaged microsystems 10 from one another and from the remainder of the original substrate 16'. It is also possible to individually attach the individual first portions 24 and/or the individual second portions 26, for example via a pick-and-place process rather than simultaneous attachment via the carrier wafers 126, 136. In the illustrated example, each of a plurality microsystems 16, a plurality of first micropackage portions 24, and a plurality of second micropackage portions 26 is provided in respective and corresponding arrays. In other embodiments only one or two of these pluralities of components 16, 24, 26 is provided in an array. For example, the first micropackage portions 24 may be provided in an array on a carrier substrate 126, with each of the microsystems 16 and the second micropackage portions 26 being individually placed at each of the first micropackaging portions 24 of the array to form a corresponding array of packaged microsystems 10 that can be released from one another via removal or separation of the carrier substrate 126.

Described below is another batch-process with potential for increasing fabrication throughput and reducing micropackage and micropackaging costs. This process offers the additional advantage of providing a micropackage 12 that can be sealed without the need for a separately provided bonding material and at much lower temperatures, thereby enabling the microsystem 16 to include materials and structures that may not withstand bonding conditions that exceed the temperature encountered in deployment conditions. The batch process and micropackage structure are not mutually exclusive.

FIG. 25 is a cross-sectional side view of an embodiment of the packaged microsystem 10, including micropackage 12 with microsystem 16 sealed in the internal cavity 14 of the micropackage. As with the previous examples, the first and second portions 24, 26 are made from different materials, and one or both of them may be metal to provide high strength, ductility, and/or high temperature capability. In this example, the second portion 26 is in the form of an insert, with its outer perimeter 34 fitting within the inner perimeter 36 of the first portion 24. In this case, both of the first and second portions 24, 26 are in the form of a shell, with respective sidewalls 32, 132 extending from respective bases 30, 130 so that the cavity 14 is partly defined by the sidewalls 132 of the insert 26.

In this embodiment, the insert 26 is configured to deform when pressed against the sealing surface 28 of the first portion 24. The insert 26 may be constructed from a material that is softer or that has a lower modulus of elasticity and/or yield strength than the material of the first portion 24 so that the second portion 26 deforms under less load or stress than the first portion 24. For instance, the first portion 24 may be stainless steel or some other steel alloy, and the second portion may be aluminum or brass. In the illustrated example, the sidewalls 132 of the insert 26 deform when pressed against the tapered sealing surface 28 of the first portion 24, located where the sidewalls 32 extend from the base 30. The first portion 24 is shaped so that the ends of the sidewalls 132 of the insert 26 are inwardly deflected and/or deformed when pressed against the sealing surface 28. The result is a press-fit at the sealing surface 28. When assembled, the distal ends of the sidewalls 132 of the insert 26 may have tapered surfaces that are complementary in shape to the sealing surface 28 of the first portion 24, providing increased surface contact between the portions 24, 26. The tapers or other deformation features could be located elsewhere along the first and/or second portions.

The sidewalls 132 of the insert 26 may be configured to deform even if made from the same material as the first portion 24 by making them sufficiently thin or providing a thinned portion along the sidewalls 132 near the base 130. A mismatch in material hardness between the two portions 24, 26 may be preferred to help form a better seal. One benefit of this configuration that relies on pressing the first and second portions 24, 26 together to form the seal is that the first and second portions 24, 26 will be pressed together when the packaged microsystem 10 is used in a high pressure environment, thereby improving the integrity of the seal when in use. It should be noted that FIG. 25 illustrates an assembled packaged microsystem after the first and second portions 24, 26 are pressed together. As will become apparent in the subsequent figures and description, the deformable insert 26 may be initially fabricated with the sidewalls 132 having untapered ends—i.e., the ends of the sidewalls 132 may become tapered only after deformation during assembly.

In the example of FIG. 25, the cavity 14 is filled with a filler 42, such as silicone or another polymer material. The filler 42 may also be provided at the gap between the perimeter 34 of the second portion 26 and the perimeter 36 of the first portion 24. A coating 40, such as the above-described alumina/Parylene coating, may be disposed over at least a portion of the outer surface of the sealed micropackage 12. In this example, the coating 40 covers the entire outer surface of the micropackage 12.

As described above, bases, sidewalls, and closures made from metallic materials can interfere with certain forms of wireless communication or otherwise affect operation of the microsystem 16. However, even with the all-metal construction of FIG. 25, the micropackage 12 can be configured to communicate through at least a portion of one of the walls 30, 130, 32, 132 via radio frequency (RF). RF signals with long wavelengths will pass through metal walls of the micropackage 12 if the wall thickness is less than the skin depth of the metal at the given frequency. The skin depth ($\delta$) in an electrically conductive material is determined by the frequency (f) of the electromagnetic wave and the properties of the electrically conductive material, including electrical resistivity ($\varphi$ and magnetic permittivity ($\mu$):

$$\delta = (\rho/\pi f \mu)^{1/2}$$

For example, for a 2 MHz RF signal, the skin depth of stainless steel 316 (SS 316) is estimated to be about 300 µm. Accordingly, a hard shell 24 made from SS 316 with a sidewall 32 thickness $t_1$ or a base 30 thickness $t_3$ that is less than 300 µm can allow a 2 MHz RF signal to pass through the package 12 and be used for wireless communication or power transfer. At least a portion of one or both of the first and second micropackage portions 24, 26 may be configured to be transparent to some portion of the electromagnetic spectrum. In particular, the transparency to the electromagnetic spectrum may be transparency to visible light, to a particular radio frequency or range of radio frequencies, to a particular infrared frequency or range of infrared frequency, or to any other portion of the electromagnetic spectrum, including portions of the spectrum that are suitable as carrier wave frequencies capable of wirelessly transmitting information to and/or from the packaged microsystem.

Figure 26:
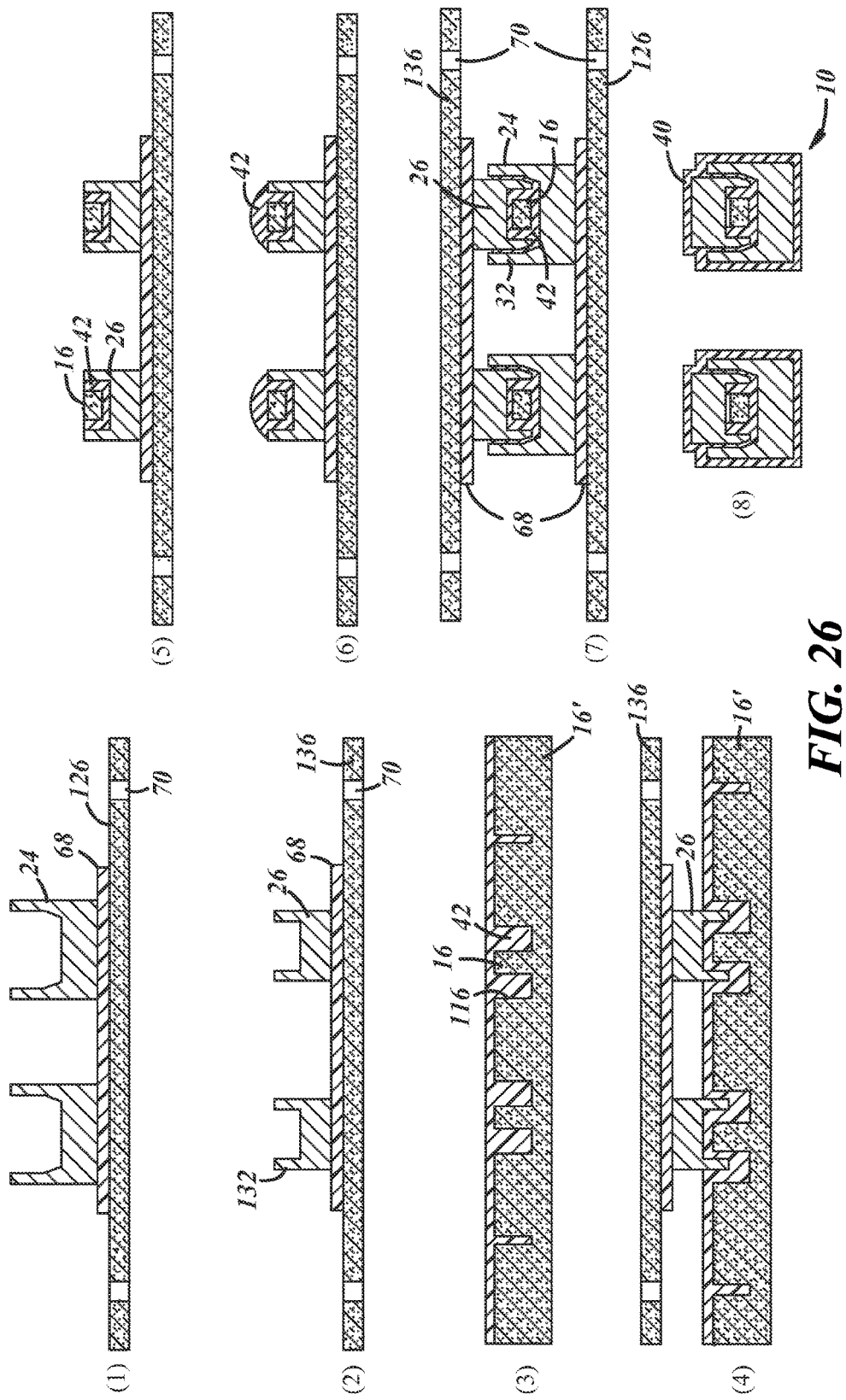
FIG. 26 depicts an illustrative batch process for fabricating multiple packaged microsystems similar to the example of FIG. 25.

An example of a method of making packaged microsystems 10 is illustrated in FIG. 26. Steps (1) and (2) of FIG. 26 respectively include fabricating or otherwise providing arrays of hard shells and deformable inserts (i.e., first and second portions 24, 26) via μEDM or other technique. This can be performed by attaching a metal substrate to a conductive carrier substrate 126, 136 using silver epoxy or some other electrically conductive bonding agent, then performing batch mode or serial mode μEDM for the desired patterns. Alignment marks 70 may also be formed in the carrier substrate 126.

The microsystems 16 may then be placed into the partly formed cavities 14 (i.e., within the sidewalls 132) of the deformable inserts 26, or alternatively into the partly formed cavities within the sidewalls 32 of the first portions 24. Silicon chips 16 are used for demonstration in FIG. 26, though other microsystem components, such as sensors and batteries, can also be integrated. This step can be performed either by pick-and-place or a batch method as shown.

In the pick-and-place method, silicon chips are placed into the cavities that are pre-filled with a small amount of silicone 42 or other compliant adhesive or filler. In the illustrated batch method, a silicon wafer 16' that includes the chips 16 to be packaged is diced partially through its thickness via trenches 116, and a layer of the filler material 42 is applied over the partially diced wafer, as shown in step (3) of FIG. 26. This wafer 16' is then aligned and assembled into the array of deformable inserts 26, with the silicon chips 16 positioned in the partially formed cavities 14 of the deformable inserts 26, as shown in step (4). The thickness of the silicon wafer 16' that extends beyond the ends of the sidewalls 132 of the inserts 26 can then be lapped away or otherwise removed to arrive at the structure of step (5).

After the chips 16 and/or other microsystem components are placed in the cavities of the inserts 26, a small amount of silicone 42 or other filler can be applied within surrounding sidewalls 32 of the hard shell 24 (i.e., first portion) and/or the deformable insert 26, as shown in step (6). The array of deformable inserts 26 can be aligned with and pressed into the array of hard shells 24 with controlled pressure, as shown in step (7). The carrier substrates 126, 136 can then be removed to release the packaged microsystems 10. In one example, the joined stack of arrays illustrated in step (7) of FIG. 26 can be immersed in acetone or other suitable solvent to dissolve the bonding material 68 (e.g., conductive epoxy) and release a plurality of individual packaged microsystems 10. Finally the micropackages 12 may be coated, such as with ALD alumina and Parylene-C.

Arrays of stainless steel (SS 316) hard shell first portions 24 and aluminum (Al 3003) deformable insert second portions 26 have been fabricated and are illustrated in the SEM images of FIGS. 27 and 28, respectively. FIG. 27(a) is a perspective view of an array of stainless steel shells 24, FIG. 27(b) is a top view of the stainless steel shells of FIG. 27(a), and FIG. 27(c) is an enlarged view of one of the shells 24 of FIG. 27(a).

FIG. 28(a) is a perspective view of an array of aluminum deformable inserts 26 and FIG. 28(b) is an enlarged view of one of the deformable inserts 26 of FIG. 28(a). FIG. 29 is a top view photographic image of the array of deformable inserts 26 of FIG. 28 with microsystem 16 components placed within the surrounding sidewalls of the deformable inserts.

Working examples of packaged microsystems 10 in accordance with the embodiment of FIG. 25 and the process of FIG. 26 have been fabricated and tested. Micropackages with exterior dimensions of $0.5 \times 0.5 \times 0.5$ mm$^3$ were formed from stainless steel first portions 24 having wherein the thickness $t_3$ of the base 30 was 0.2 mm and the thickness $t_1$ of the side walls was 0.08 mm. The 0.2 mm base thickness is expected to allow a 2 MHz RF signal to pass therethrough, as described above. The tapered region at the bottom of the sidewalls 132 was $h_2=100$ μm in height and $W_3=15$ μm in width (see FIG. 25). These stainless steel hard shells are illustrated in the arrays of FIG. 27.

The corresponding second portions 26 (i.e., the deformable inserts) were formed with dimensions of $0.33 \times 0.33 \times 0.3$ mm$^3$, wherein the thickness of the base 130 was 0.2 mm and the thickness of the sidewalls 132 was 0.045 mm, providing a cavity having dimensions of $0.24 \times 0.24 \times 0.1$ mm$^3$. These dimensions were selected with the help of FEA modeling similar to that discussed in conjunction with FIGS. 3 and 4 with a safety factor of >3.1 for the stainless steel shell and >2.4 for the aluminum inserts. These aluminum inserts are illustrated in the arrays of FIG. 28. Other dimensions are of course possible. It is noted that the ends of the sidewalls 132 of the aluminum inserts are formed with generally sharp exterior corners—i.e., they are not yet deformed or chamfered as shown in the example of FIG. 25.

During assembly in accordance with FIG. 26, when the excess thickness of the wafer substrate 16' was removed to release the individual microsystems 16 into the silicone-filled inserts 26 is step (5), an additional optional step of further reducing the thickness of the releases microsystems was performed. Plasma etching, for example, can be used so that the ends of the sidewalls 132 of the inserts extend slightly beyond the exposed side of the microsystem 16. This can enhance the mechanical isolation of the microsystem when assembled.

The arrays of first and second portions 24, 26 were pressed together as shown in step (6) of FIG. 26 with a maximum nominal pressure of about 150 MPa applied on the deformable inserts. This pressure was found suitable for insert deformation that created a sufficient seal without damaging the microsystem 16. The press-fit deformation of the deformable inserts 26 may be referred to as micro-crimping and is performed in batch mode in FIG. 26 and in the fabricated samples. Some of the assembled micropackages were reopened after release, and the silicon chips inside were found to remain intact after the micro-crimping step.

One of the deformable inserts is illustrated in the SEM image of FIG. 30 after removal from an assembled packaged microsystem. Deformation of the sidewalls of the insert is apparent, particularly at the ends of the sidewalls where material was plastically deformed at the interface with the angled sealing surface at the bottom of the stainless steel shell. Measured angles of deformation of the sidewalls of the aluminum inserts ranged from 5 to 17 degrees, which generally agrees with the 8.5 degree taper at the bottom of the sidewalls of the stainless steel shells.

Packaged microsystems coated with a coating 40 as described above, including layers of alumina and Parylene-C, were subjected to the above-described high-pressure and hot brine tests. The hot brine test was performed for a duration of 72 hours with no apparent leakage or corrosion. Maximum pressure during the initial high-pressure testing was 62 MPa, after which no micropackage deformation was detected by an optical microscope or by scanning laser interferometer. A second set of high-pressure tests was performed at multiple pressures, including successively pressures of 50, 70, 90, 120, 150, and 200 MPa. No external deformation of the micropackages was observed. During the high-pressure tests, the aluminum inserts were pressed further into the stainless steel shells by an amount ranging from 5 to 10 microns. Upon disassembly, the microsystems (i.e., Si-chips) proved to be undamaged.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, where glass or ceramic is described above as a suitable material for one or more components of the disclosed embodiments, sapphire could be use in lieu of or in addition to the glass or ceramic. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The singular forms "a," "an," and "the" include plural referents unless the context clearly dictates otherwise.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a defacto equivalent of any other member of the same list solely based on their presentation in a common group without indications to the contrary.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

All publications and patent applications are herein incorporated by reference to the same extent as if each individual publication or patent application was specifically and individually indicated to be incorporated by reference.

The invention claimed is:

1. A method of packaging microsystems, comprising:
  (a) providing a plurality of microsystems, a plurality of first micropackage portions, and a plurality of second micropackage portions, at least one of said pluralities being provided in an array on a substrate;
  (b) placing each of the microsystems between one of the first micropackage portions and one of the second micropackage portions to form a corresponding array of packaged microsystems; and
  (c) releasing the packaged microsystems from the corresponding array to form a plurality of individual packaged microsystems,
  wherein the method further comprises:
    forming a trench in a wafer substrate to at least partially define the plurality of microsystems, whereby the plurality of microsystems is provided in the array of step (a);
    attaching the plurality of first micropackage portions to the wafer substrate so that one of the first micropackage portions is located at each one of the at least partially defined microsystems; and
    attaching the plurality of second micropackage portions to the plurality of first micropackage portions to form the corresponding array of packaged microsystems of step (b).

2. The method of claim 1, wherein the step of forming includes forming the trench in a first side of the wafer substrate and partially through the thickness of the wafer substrate in a first direction, and the plurality of second micropackage portions is attached from an opposite second direction.

3. The method of claim 2, further comprising, before step (b), forming a trench in an opposite second side of the wafer substrate to release the microsystems from one another.

4. The method of claim 2, further comprising, before step (b), removing the excess thickness of the wafer substrate from an opposite second side of the wafer substrate to release the microsystems from one another.

5. The method of claim 1, wherein step (b) includes individually placing each microsystem, each first micropackage portion, or each second micropackage portion into said corresponding array.

6. The method of claim 1, further comprising the step of attaching the first and second micropackage portions together using a bonding material.

7. The method of claim 1, further comprising the step of attaching the first and second micropackage portions together by pressing the first and second micropackage portions together and deforming at least one of the first or second micropackage portions.

8. The method of claim 1, wherein step (a) comprises:
providing the first micropackage portions on a carrier substrate in the array of step (a);
providing the second micropackage portions on a carrier substrate in the array of step (a); or
providing the first micropackage portions on a first carrier substrate in the array of step (a) and providing the second micropackage portions on a second carrier substrate in a corresponding array.

9. The method of claim 1, wherein the first micropackage portions, the second micropackage portions, or both the first and the second micropackage portions include a feedthrough for external communication with the microsystems.

10. The method of claim 1, wherein mating surfaces of the first and second micropackage portions have interlocking features.

11. The method of claim 1, wherein one or both of the first and second micropackage portions is configured to be at least partially transparent to electromagnetic radiation.

12. The method of claim 11, wherein both of the first and second micropackage portions are metal.

13. The method of claim 12, wherein one of the first or second micropackage portions is stainless steel.

14. The method of claim 11, wherein the portion(s) configured to be at least partially transparent to electromagnetic radiation comprises glass, stainless steel, aluminum, brass, or ceramic.

15. The method of claim 1, wherein the packaged microsystems each include a pressure sensor and one or both of the first and second micropackage portions is configured to predictably deform in response to external pressure applied to the packaged microsystems.

16. The method of claim 1, wherein the packaged microsystems are configured to withstand an external fluid pressure of 50 MPa or greater.

17. The method of claim 1, wherein the external dimensions of the packaged microsystems corresponds to a volume of 1 $mm^3$ or less.

18. The method of claim 17, wherein the volume is in a range from 0.125 $mm^3$ to 0.512 $mm^3$.

19. The method of claim 1, wherein the maximum external dimension of the packaged microsystems is less than 1 mm.

20. The method of claim 1, further comprising the step of disposing a coating over at least a portion of the outer surfaces of the packaged microsystems, the coating comprising alumina and poly(p-xylylene).

21. A method of packaging microsystems, comprising:
(a) locating a microsystem between first and second micropackage portions; and
(b) pressing the first and second micropackage portions together,
wherein at least one of the micropackage portions is configured to deform during step (b) to seal the microsystem in a cavity formed between the first and second micropackage portions, wherein the microsystem is one of a plurality of microsystems and each of the first and second micropackage portions is one of a plurality of first and second micropackage portions, at least one of said pluralities being provided in an array on a substrate before step (a), the method further comprising the step of releasing a plurality of individual packaged microsystems from the array after step (b).

22. The method of claim 21, wherein step (a) includes locating a plurality of microsystems between a corresponding plurality of first and second micropackage portions such that each one of the microsystems is sealed in an individual cavity formed between one of the first micropackage portions and one of the second micropackage portions in step (b).

23. The method of claim 21, wherein the cavity includes a filler material, the filler material being supported by one of the micropackage portions before step (b).

24. The method of claim 21, wherein one or both of the first and second micropackage portions is configured to be at least partially transparent to electromagnetic radiation.

25. The method of claim 24, wherein both of the first and second micropackage portions are metal.

26. The method of claim 25, wherein one of the first or second micropackage portions is stainless steel.

27. The method of claim 24, wherein the portion(s) configured to be at least partially transparent to electromagnetic radiation comprises glass, stainless steel, aluminum, brass, or ceramic.

28. The method of claim 21, wherein the packaged microsystems each include a pressure sensor and one or both of the first and second micropackage portions is configured to predictably deform in response to external pressure applied to the packaged microsystems.

29. The method of claim 21, wherein the packaged microsystems are configured to withstand an external fluid pressure of 50 MPa or greater.

30. The method of claim 21, wherein the external dimensions of the packaged microsystems corresponds to a volume of 1 $mm^3$ or less.

31. The method of claim 30, wherein the volume is in a range from 0.125 $mm^3$ to 0.512 $mm^3$.

32. The method of claim 21, wherein the maximum external dimension of the packaged microsystems is less than 1 mm.

33. A method of packaging microsystems, comprising:
(a) locating a microsystem between first and second micropackage portions;
(b) pressing the first and second micropackage portions together, wherein at least one of the micropackage portions is configured to deform during step (b) to seal the microsystem in a cavity formed between the first and second micropackage portions; and
(c) disposing a coating over at least a portion of the outer surfaces of the packaged microsystems, the coating comprising alumina and poly(p-xylylene).

* * * * *